US012287579B2

(12) United States Patent
Lee

(10) Patent No.: US 12,287,579 B2
(45) Date of Patent: Apr. 29, 2025

(54) HIGH-PERFORMANCE EUV MICROSCOPE DEVICE WITH FREE-FORM ILLUMINATION SYSTEM STRUCTURE HAVING ELLIPTICAL MIRROR

(71) Applicant: ESOL Inc., Hwaseong-si (KR)

(72) Inventor: Dong Gun Lee, Hwaseong-si (KR)

(73) Assignee: ESOL Inc., Hwaseong-si (KR)

( * ) Notice: Subject to any disclaimer, the term of this patent is extended or adjusted under 35 U.S.C. 154(b) by 324 days.

(21) Appl. No.: 17/895,069

(22) Filed: Aug. 25, 2022

(65) Prior Publication Data

US 2024/0045338 A1 Feb. 8, 2024

(30) Foreign Application Priority Data

Aug. 5, 2022 (KR) .......................... 10-2022-0097890

(51) Int. Cl.
*G03F 7/00* (2006.01)
(52) U.S. Cl.
CPC ...... *G03F 7/70116* (2013.01); *G03F 7/70075* (2013.01); *G03F 7/702* (2013.01)
(58) Field of Classification Search
CPC .. G03F 7/70075; G03F 7/70116; G03F 7/702; G03F 1/84; H01L 21/02115; H01L 21/02126; H01L 21/02274; H01L 21/6831; H01J 2237/332; H01J 37/32357; H01J 37/32449; G06F 3/033; G06F 3/03545; G06F 3/0414; G06F 3/0416; G06F 3/046; G06F 3/048; C23C 16/26; C23C 16/452; C23C 16/50; C23C 16/56
See application file for complete search history.

(56) References Cited

U.S. PATENT DOCUMENTS

| | | | |
|---|---|---|---|
| 6,864,490 B1 | 3/2005 | Underwood et al. | |
| 2015/0002925 A1 | 1/2015 | Endres et al. | |
| 2015/0334814 A1* | 11/2015 | Moriya | B23K 26/06 250/504 R |
| 2017/0235031 A1* | 8/2017 | Takehisa | G02B 17/004 359/566 |
| 2020/0394778 A1* | 12/2020 | Yoshitake | G21K 7/00 |
| 2023/0131024 A1* | 4/2023 | Lee | G03F 1/24 250/372 |

(Continued)

FOREIGN PATENT DOCUMENTS

| | | |
|---|---|---|
| KR | 10-1258344 B1 | 4/2013 |
| KR | 10-1370203 B1 | 3/2014 |
| KR | 10-1606227 B1 | 3/2016 |

(Continued)

*Primary Examiner* — Deoram Persaud
(74) *Attorney, Agent, or Firm* — Revolution IP, PLLC

(57) ABSTRACT

A high performance EUV microscope device with a free-form illumination system having an elliptical mirror, includes: an EUV source for outputting EUV light; a spherical mirror having a two-axis driving unit which receives and reflects the EUV light output from the EUV light source and controls a reflection direction of the incident light through two-axis angle scanning; an optical path changing means for receiving the reflected light reflected from the spherical mirror and providing illumination light to a target object to be measured; a zone plate lens for focusing the light reflected after entering the target object; and a photodetector for receiving the light focused by the zone plate lens.

8 Claims, 6 Drawing Sheets

(56) References Cited

U.S. PATENT DOCUMENTS

2024/0011922 A1\* 1/2024 Lee ................... G03F 7/70983
2024/0219699 A1\* 7/2024 Lee ................... G02B 21/0032

FOREIGN PATENT DOCUMENTS

| KR | 10-2020-0121545 A | 10/2020 |
| KR | 10-2020-0121546 A | 10/2020 |
| KR | 10-2021-0043701 A | 4/2021 |

\* cited by examiner

Prior Art

Single beam (at the left) irradiated to EUV mask and calculation result of cumulative light intensity distribution (at the right) irradiated to EUV mask surface through scanning of spherical mirror Uniformity improvement process of beam irradiated to mask through scanning of spherical mirror Angle distribution calculation result of illumination beam irradiated to EUV mask surface through angle control of plane mirror

HIGH-PERFORMANCE EUV MICROSCOPE DEVICE WITH FREE-FORM ILLUMINATION SYSTEM STRUCTURE HAVING ELLIPTICAL MIRROR

FIELD OF THE INVENTION

The present invention relates to a high performance EUV microscope device with a freeform illumination system, and more particularly, to a high performance EUV microscope device with a freeform illumination system having an elliptical mirror, capable of realizing various and precise illumination shapes, reducing costs and simplifying the structure by simplifying an optical system.

BACKGROUND ART

Lithography is a very core process in development of semiconductor technology. The age to which EUV lithography using 13.5 nm is applied has come from the age of ArF lithography using 193 nm, and a more refined process utilizing next-generation EUV lithography equipment can be performed.

An EUV pellicle is a thin film for protecting an EUV mask, and serves to prevent a mask from being polluted by a defect during lithography, thereby improving a pattern formation defect rate when a refined pattern is formed. Transmittance of the protective film and uniformity in transmittance have a direct influence on semiconductor lithography yield. So, it is very important to manage transmittance quality of the EUV pellicle material in production and management of EUV pellicles.

Furthermore, since light reflected from the EUV pellicle generates a pattern error at an overlapping exposure portion of a semiconductor wafer, it is also necessary to manage reflection in the EUV pellicle. The quality management of transmittance and reflection of the EUV pellicle is performed through transmittance/reflection measuring process management using an EUV transmittance and reflection measuring device.

Meanwhile, in order to smoothly apply an EUV mask to a mass production process, like the ArF mass production technology, a quality management of the EUV pellicle through the EUV transmittance and reflection measuring device of the EUV pellicle is essential. In order to realize such a device, unlike the conventional ArF transmittance measuring device, development of a new EUV transmittance and reflection measuring device to which EUV light and an EUV optical system are applied is required.

A conventional art is a device that uses an EUV light source of a laser produced plasma (LPP) type which irradiates ND:YAG Q-switched pulse laser to a target metal to form plasma and generate EUV light, irradiates EUV monochromic light to a sample using a monochromator having an oblique incidence mirror, a grating, and a slit, divides the EUV monochromic light into a reflective light and transmitted light using a beam splitter, detects the reflective light to form a reference signal for monitoring a change in the light source, reflects the transmitted light from the mask sample to form a sample reflection signal in a detector, and measures reflection of the sample mask using the reference signal and the sample reflection signal.

A measuring device according to another conventional art includes: an EUV light source unit of a high order harmonic method; a multi-layer (ML) mirror unit having a multilayer thin film for selecting and reflecting only light having a predetermined wavelength from light output from the EUV light source unit; a transmitted light measuring sensor for irradiating reflective light having the predetermined wavelength to a target object and measuring light transmitting the target object; and a reflective light measuring sensor for measuring light reflected from the target object after being irradiated to the target object.

Meanwhile, FIG. 1 is a diagram of a conventional EUV microscope device using a freeform illumination system. The conventional EUV microscope device includes an inspection device to which a freeform illumination system which reflects and steers an EUV light source to form various shapes of incident light angle distribution. In FIG. 1, the conventional EUV microscope device has a steering mirror ($M_A$), a plane mirror ($M_B$) for reflecting the reflected light again, and an ellipsoidal mirror ($M_C$) for irradiating the light reflected from the plane mirror to an EUV mask, which is a target object to be measured. The light reflected from the target object is incident on a detector (CCD) to inspect the EUV mask.

The conventional art constructed as described above has the advantage of implementing various types of freeform illumination, but has several disadvantages in that an expensive aspheric lens is applied, in that it is deteriorated in uniformity of illumination light since one aspherical mirror and the plane mirror are applied, and in that there is a limitation in controlling illumination structures of various types.

As a result, the inspection apparatus to which the conventional freeform illumination system is applied has several problems in that the optical system is somewhat complicated, in that a cost increase is generated since using the expensive aspheric lens, and especially, in that the price is greatly increased since it is difficult to manufacture the aspheric lens.

PATENT LITERATURE

Patent Documents

| | |
|---|---|
| U.S. Pat. No. 6,864,490 | KR 10-2020-0121546 |
| KR 10-2020-0121545 | US 2015-0002925 |
| KR 10-1370203 | KR 10-2021-0043701 |
| KR 10-1258344 | KR 10-1606227 |

SUMMARY OF THE INVENTION

Accordingly, the present invention has been made in view of the above-mentioned problems occurring in the prior art, and it is an object of the present invention to provide a high performance EUV microscope device with a freeform illumination system which does not use an expensive aspherical optical system and is at low cost.

Particularly, it is another object of the present invention to provide a high performance EUV microscope device with a freeform illumination system capable of securing uniformity of illumination light, and easily controlling an incident angle and a position through angle scanning of a spherical mirror and a plane mirror.

To accomplish the above object, according to the present invention, there is provided a high performance EUV microscope device with a freeform illumination system having an elliptical mirror including: an EUV source for outputting EUV light; a spherical mirror having a two-axis driving unit which receives and reflects the EUV light output from the EUV light source and controls a reflection direction of the incident light through two-axis angle scanning; an optical path changing means for receiving the reflected light reflected from the spherical mirror and providing illumination light to a target object to be measured; a zone plate lens for focusing the light reflected after entering the target object; and a photodetector for receiving the light focused by the zone plate lens, wherein the spherical mirror is rotated by the driving unit to control the reflection direction of the reflected light, and the illumination light irradiated to the target object is controlled by the optical path changing means receiving the reflected light.

Moreover, the optical path changing means includes: one plane mirror receiving the reflected light reflected from the spherical mirror to determine an angle of the illumination light provided to the target object to be measured; and an elliptical mirror forming freeform illumination light through the plane mirror to be incident to the target object, wherein the optical path changing means selectively controls a reflection angle of the spherical mirror and a reflection angle of the plane mirror to determine a reflection angle.

Furthermore, the angle of the spherical mirror is adjusted to adjust a position of light entering the plane mirror, and the angle of the plane mirror is adjusted to adjust an incident angle of the illumination light irradiated to the target object.

Additionally, the EUV light source is a high-order harmonic generation (HHG) type EUV source or a coherent EUV source.

In addition, the plane mirror is driven at two-dimensional angle to scan illumination light according to a position of the target object.

Moreover, in order to have a uniform intensity distribution of the illumination light irradiated to the target object to be measured, the plane mirror controls the angle of the spherical mirror in a fixed state so as to control the intensity distribution of the illumination light. In order to determine an incident angle distribution of the illumination light irradiated to the target object, the spherical mirror controls the angle of the plane mirror in a fixed state so as to control the incident angle of the illumination light.

Furthermore, in order to have a uniform intensity distribution of the illumination light irradiated to the target object to be measured, the plane mirror controls the angle of the spherical mirror in a fixed state so as to control the intensity distribution of the illumination light and control the total cumulative irradiation amount at a position where illumination light is irradiated to the target object to have the same value, and after completion of the scanning measurement of a predetermined region of the target object, the target object is moved through a stage determining X-axis and Y-axis direction driving of the target object, and then, the angle of the spherical mirror is controlled with respect to the predetermined region so as to perform scanning measurement with respect to the predetermined region so that the total cumulative irradiation amount with respect to the corresponding region has the same value.

Additionally, the elliptical mirror provides the illumination light having a plurality of optical axes incident through the plane mirror has reflection characteristics to enter the same position of the target object, so that the illumination light enters the same position of the target object, and the incident angle of light entering the target object is determined according to the position that the illumination light reflected from the plane mirror enters the elliptical mirror.

That is, the elliptical mirror is designed such that the illumination light having a plurality of optical axes incident through the plane mirror has reflection characteristics to enter the same position of the target object, so that the illumination light enters the same position of the target object even in a case of entering with multiple optical axes.

In addition, since the elliptical mirror is designed such that the illumination light having a plurality of optical axes incident through the plane mirror has reflection characteristics to enter the same position of the target object, the elliptical mirror allows the incident light having the multiple optical axes to enter the same position of the target object through the plane mirror in a fixed state without any driving unit.

Furthermore, the incident light incident to the target object enters the same position at different angles, and assuming that the total cumulative irradiation amount is I1 and the total cumulative irradiation amount of light entering another position near the same position is I2, I1 and I2 are controlled to have the same value.

As described above, the high performance EUV microscope device with the freeform illumination system according to the present invention can obtain freeform illumination light not by using the conventional expensive aspherical lens but by using a combination of a spherical mirror and a plane mirror and one elliptical mirror, thereby reducing an optical system cost and simplifying the structure.

Moreover, the high performance EUV microscope device with the freeform illumination system according to the present invention can obtain uniformity of illumination by using only the spherical mirror and the plane mirror, thereby more precisely measuring the EUV mask.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Hereinafter, a high performance EUV microscope device with a freeform illumination system having an elliptical mirror according to preferred embodiments of the present disclosure will be described in detail with reference to the accompanying drawings.

The high performance EUV microscope device with a freeform illumination system having an elliptical mirror according to a preferred embodiment of the present invention includes: an EUV source for outputting EUV light; a spherical mirror having a two-axis driving unit which receives and reflects the EUV light output from the EUV light source and controls a reflection direction of the incident light through two-axis angle scanning; an optical path changing means for receiving the reflected light reflected from the spherical mirror and providing illumination light to a target object to be measured; a zone plate lens for focusing the light reflected after entering the target object; and a photodetector for receiving the light focused by the zone plate lens, wherein the spherical mirror is rotated by the driving unit to control the reflection direction of the reflected light, and the illumination light irradiated to the target object is controlled by the optical path changing means receiving the reflected light.

The high performance EUV microscope device with a freeform illumination system having an elliptical mirror according to a preferred embodiment of the present invention is characterized in that a freeform illumination system is realized by using a spherical mirror, a plane mirror and an elliptical mirror without using an aspherical lens which is expensive, and an EUV microscope device for inspecting an EUV mask through the illumination system is provided.

The present invention will be described in detail with reference to FIGS. 2 to 6 as follows.

Figure 2:
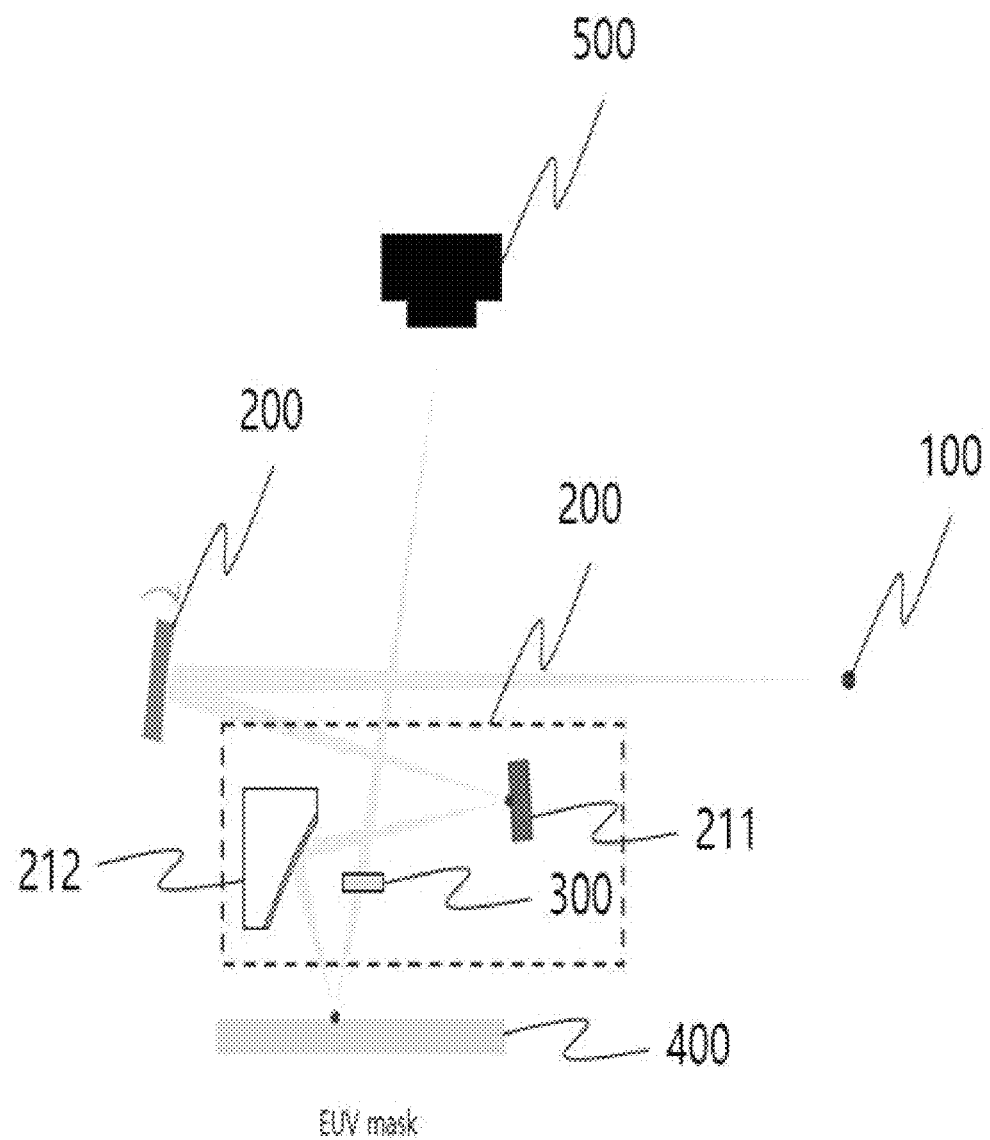
FIG. 2 is a schematic diagram of a high performance EUV microscope device with a freeform illumination system having an elliptical mirror according to an embodiment of the present invention.

FIG. 2 is a block diagram of a high performance EUV microscope device with a freeform illumination system having an elliptical mirror according to a preferred embodiment of the present invention.

Figure 1:
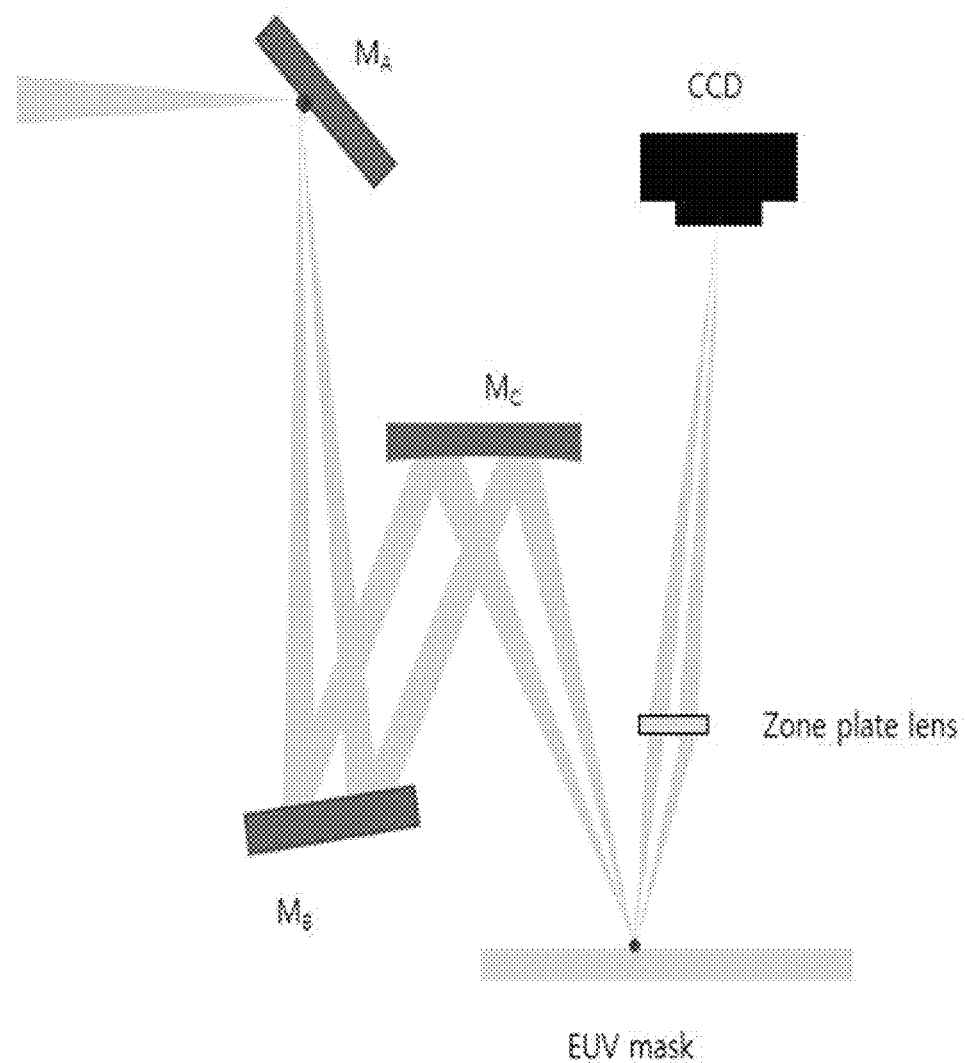
FIG. 1 is a diagram of a conventional freeform illumination system.

As illustrated in FIG. 1, the high performance EUV microscope device with a freeform illumination system having an elliptical mirror according to a preferred embodiment of the present invention includes: an EUV source 100 for providing EUV light; a spherical mirror 200 for focusing the light output from the EUV light source; and an optical path changing means for receiving the illumination light focused by the spherical mirror.

The optical path changing means includes: a plane mirror 211 for determining an incident angle of the illumination light for irradiating the reflected light to an EUV mask, which is a target object 400 to be measured when the light focused on the spherical mirror 200 is reflected; and an elliptical mirror 212 for irradiating the light reflected by the plane mirror 211 to the target object 400.

Additionally, the high performance EUV microscope device with a freeform illumination system having an elliptical mirror according to the preferred embodiment of the present invention further includes: a zone plate lens 300 for imaging the light reflected from the target object 400; and a photodetector 500 for detecting the light transmitted through the zone plate lens.

Preferably, the EUV source 100 includes a light source device for outputting a high-order harmonic generation (HHG) type EUV source or a coherent EUV source.

In the EUV microscope device according to the present invention, the freeform illumination system is implemented through a combination of the spherical mirror 200 and the plane mirror 211 and the elliptical mirror 212 of the optical path changing means 210. Here, the spherical mirror 200 and the plane mirror 211 are configured to have one driving unit (not shown) so as to be able to scan at a two-axis angle, thereby controlling a reflection angle of light focused through the two-axis angle driving of the spherical mirror.

Accordingly, a freeform illumination system is implemented on a pupil surface through the two-dimensional angle scanning using the spherical mirror 200 and the optical path changing means 210, and scans illumination light entering the target object (sample) according to a position through the two-dimensional angle scanning of the spherical mirror 210, thereby providing the high performance EUV microscope device having illumination with uniform light intensity.

In particular, since the high performance EUV microscope device according to the present invention has the spherical mirror 200 and the optical path changing means 210 to which the elliptical mirror is applied, the high performance EUV microscope device can easily control the illumination light having uniform light distribution and the incident angle of the illumination light without using any aspherical lens, thereby precisely inspecting various defects of an EUV mask to which the present invention is applied.

Figure 3:
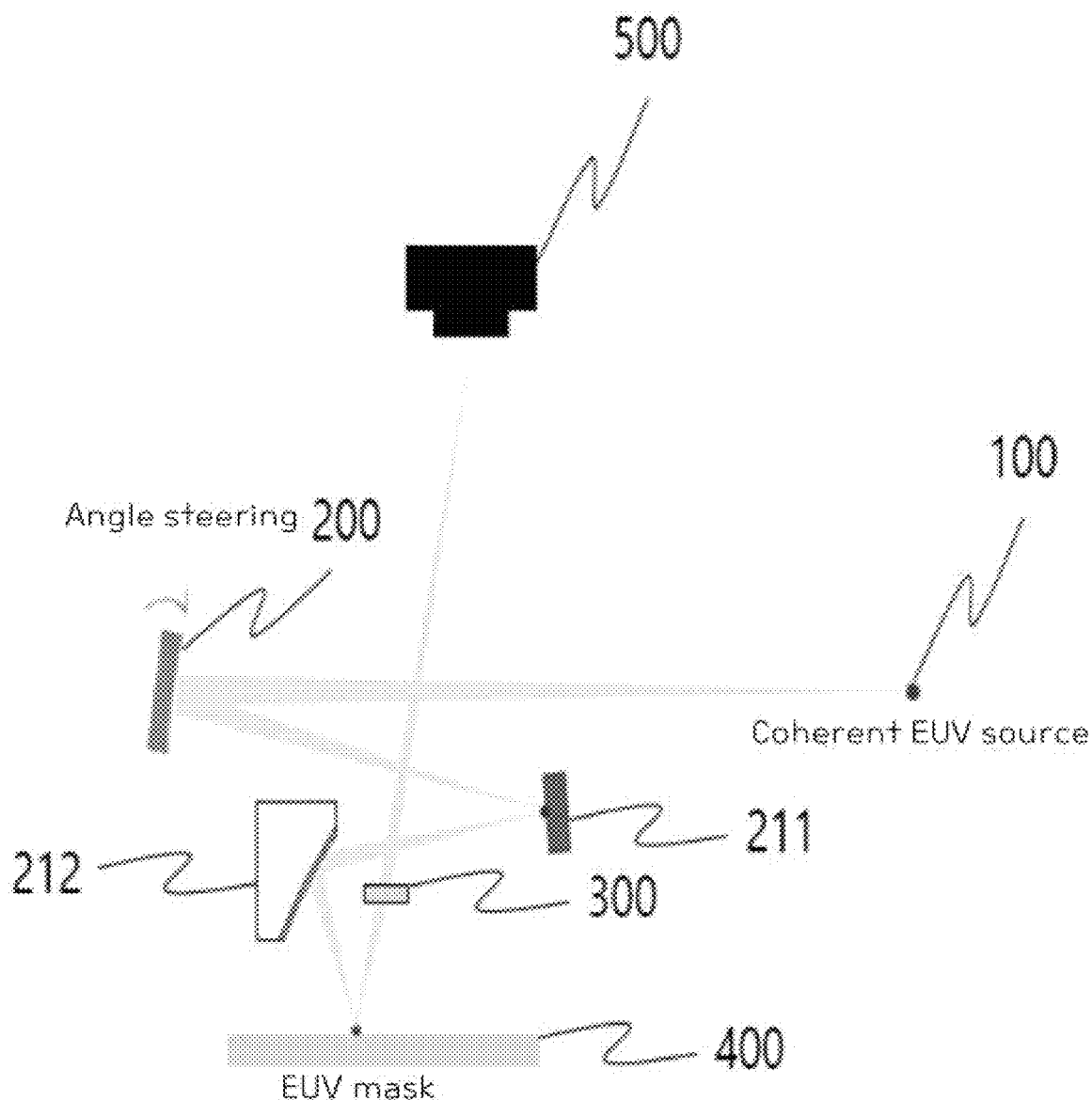
FIG. 3 is a diagram of a high performance EUV microscope device of a freeform illumination system having an elliptical mirror according to an embodiment of the present invention.

FIG. 3 is a diagram illustrating a high performance EUV microscope device with a freeform illumination system having an elliptical mirror according to an embodiment of the present invention. FIG. 3 illustrates how to obtain a uniform light quantity distribution of the illumination light provided to the target object through scanning of the spherical mirror 200. Beam with uniform intensity is formed on the surface of the plane mirror 211 through the two-dimensional angle scanning of the spherical mirror 200, and an image of the beam with uniform intensity is transferred to the EUV mask through the elliptical mirror 212, thereby forming EUV illumination with uniform intensity on the surface of the EUV mask.

Figure 4:
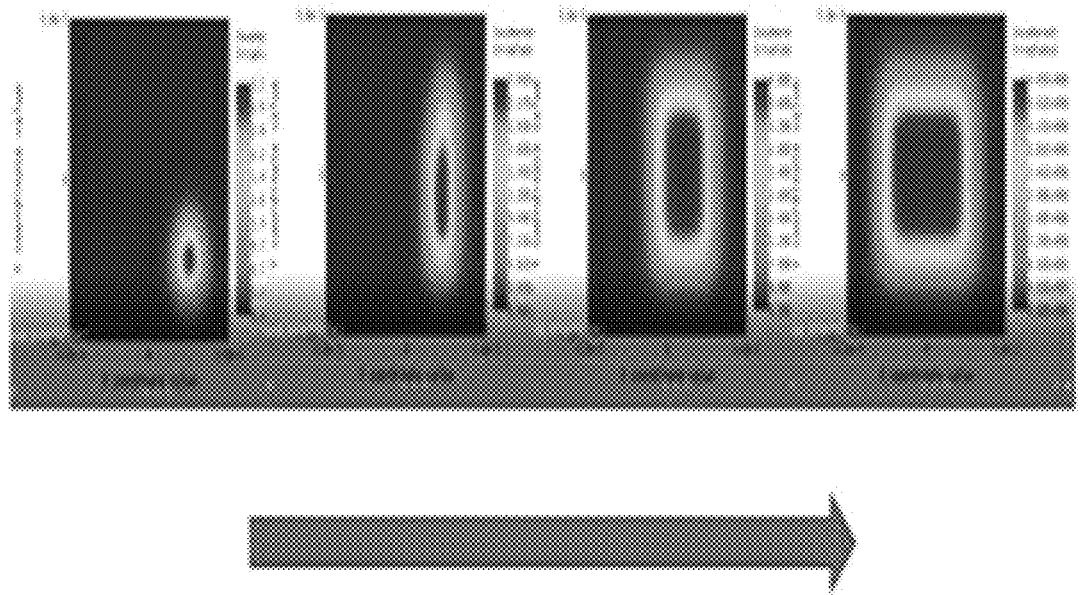
FIG. 4 is a calculation result of a cumulative light intensity distribution irradiated to an EUV mask surface of FIG. 3.

FIG. 4 is a calculation result of a cumulative light intensity distribution irradiated to an EUV mask surface of FIG. 3. The calculation result of the cumulative light intensity distribution shows a single beam (at the left) irradiated to the EUV mask and a calculation result of cumulative light intensity distribution (at the right) irradiated to the EUV mask surface through scanning of the spherical mirror 200. That is, FIG. 4 shows a uniformity improvement process of beam irradiated to the EUV mask, which is the target object, through scanning of the spherical mirror 200. Here, the spherical mirror performs scanning and the plane mirror is in a fixed state.

Through a simulation result illustrated in FIG. 4, it was confirmed that illumination light of a 5 um×5 um region was irradiated to the EUV mask surface through the angle scanning of the spherical mirror, and a uniform intensity distribution was formed with respect to a 2.5 um×2.5 um region, which was about half of the irradiated region.

Here, after the measurement of a predetermined region of the target object is completed through the angle scanning of the spherical mirror, the target object is moved, and then, the measurement is started again.

In other words, in order to have a uniform intensity distribution of the illumination light irradiated to the target object to be measured, the plane mirror controls the angle of the spherical mirror in a fixed state and controls the intensity distribution of the illumination light to perform a first measurement process to complete the scanning measurement of the predetermined region of the target object to be measured. After the first measurement process, in order to perform a second measurement process, the target object is moved through a stage determining X-axis and Y-axis direction driving of the target object, and then, the plane mirror controls the angle of the spherical mirror with respect to the predetermined region so as to perform the scanning measurement with respect to the predetermined region.

Since the measurement region through the angle scanning of the spherical mirror is scanned within a range of a few microns, in order to scan the entire area of the EUV mask, inspection of the entire mask is performed through the position change for the stage driving control.

Figure 5:
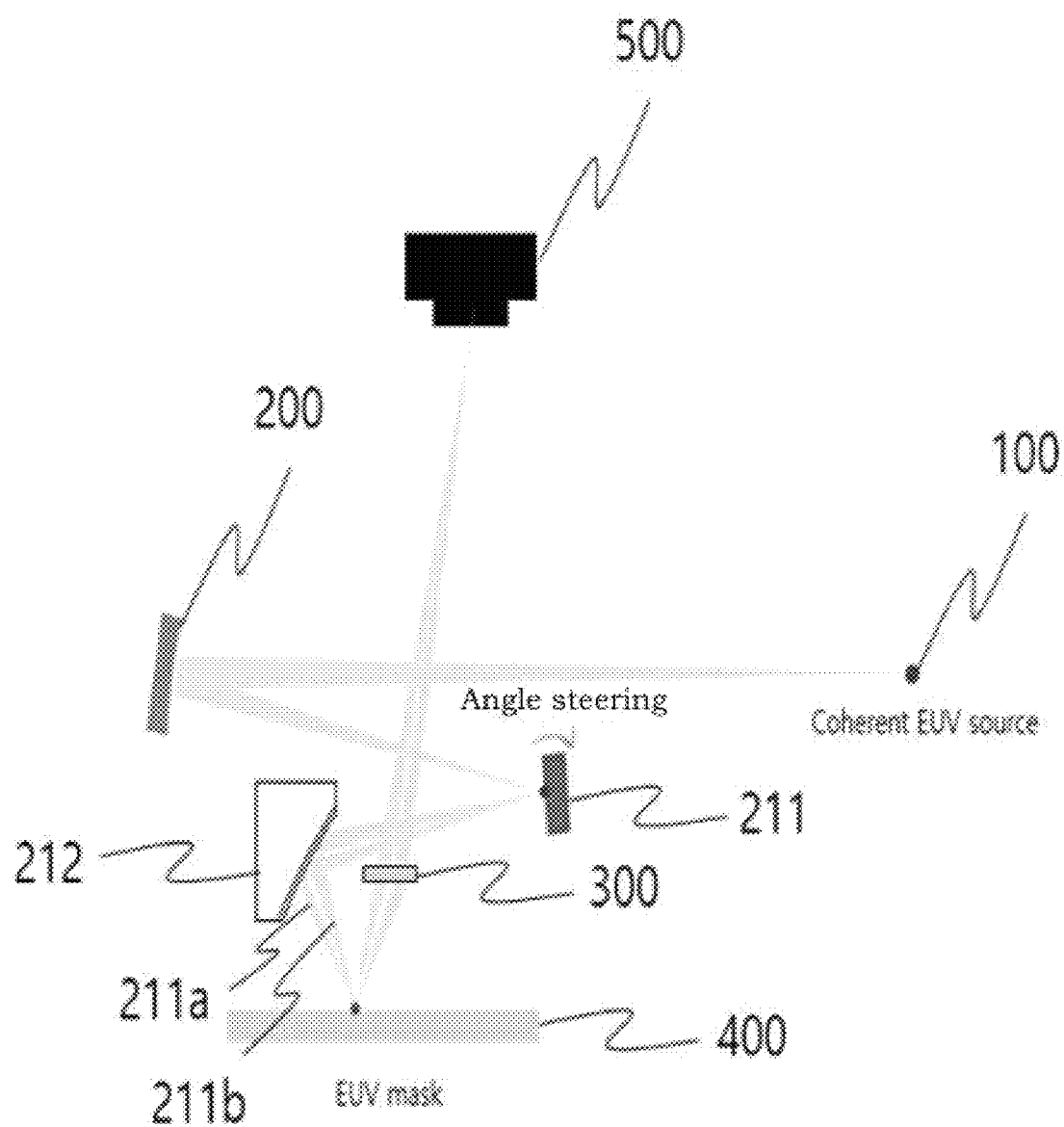
FIG. 5 is a diagram of a high performance EUV microscope device of a freeform illumination system having an elliptical mirror according to another embodiment of the present invention.

FIG. 5 is a diagram of a high performance EUV microscope device of a freeform illumination system having an elliptical mirror according to another embodiment of the present invention.

The angle of the spherical mirror is to adjust a position to reach the elliptical mirror through the two-dimensional angle adjustment of the plane mirror in the fixed state. In this instance, the plane mirror includes a first plane reflected light 211a which is one optical axis reflected from the plane mirror of the optical path changing unit and a second planar reflected light 211b which is another optical axis.

Here, the elliptical mirror has reflection characteristics such that the illumination light having a plurality of optical axes incident through the plane mirror enters the same position of the target object, thereby providing illumination light.

Furthermore, the incident angle of light entering the target object is determined according to the incident position of the elliptical mirror.

The illumination light located on all surfaces of the elliptical mirror 212 is irradiated at the same position as the EUV mask surface. In this instance, where the incident angle of the irradiated beam is determined according to the position of the beam reaching the surface of the elliptical mirror. That is, the incident angle of the beam irradiated to the EUV mask is adjusted through the two-dimensional angle adjustment of the plane mirror 211.

Figure 6:
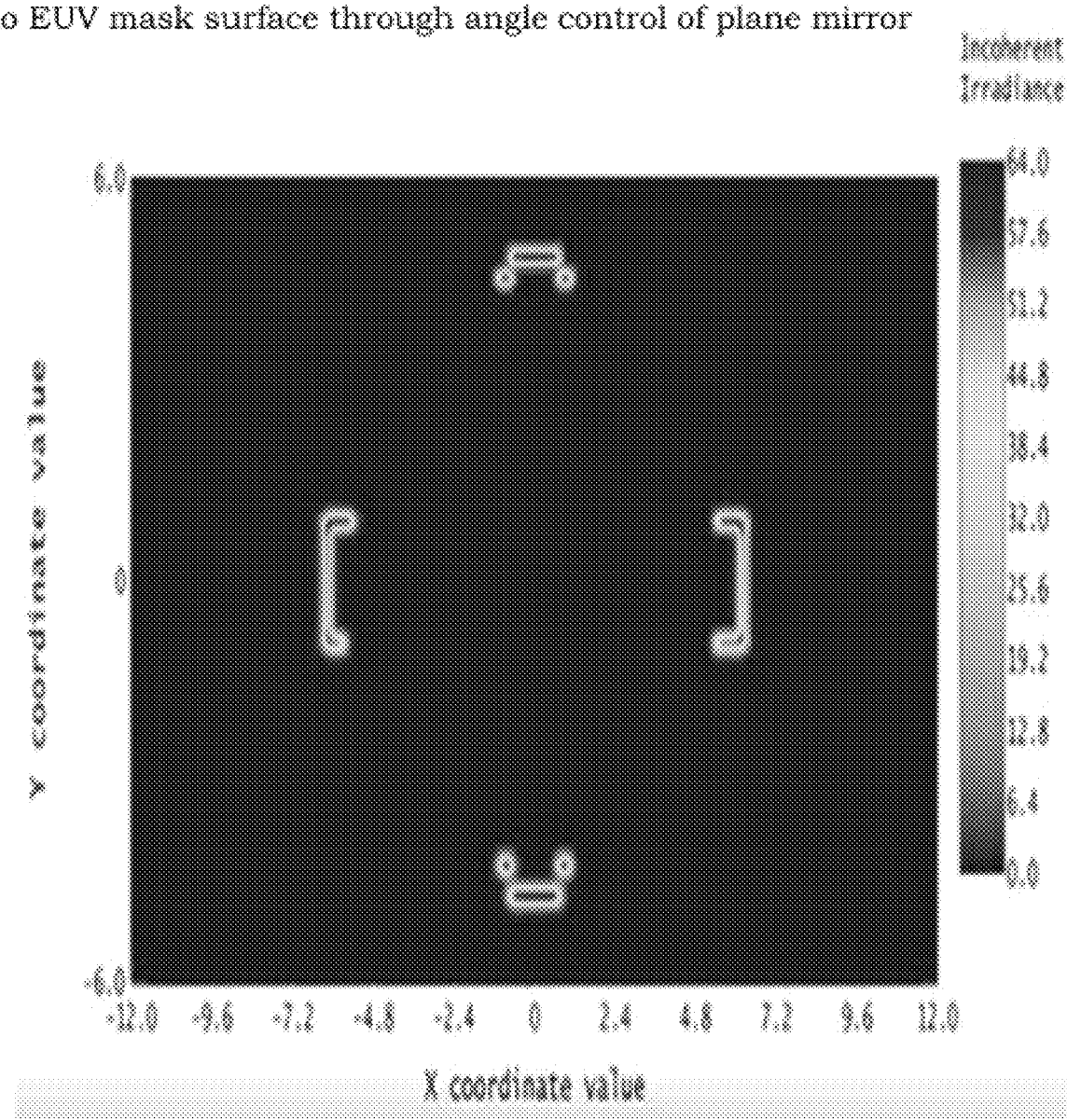
FIG. 6 is a calculation result of angular distribution of illumination beam irradiated to the EUV mask surface according to an angle adjustment of the plane mirror according to FIG. 5.

FIG. 6 is a calculation result of angular distribution of illumination beam irradiated to the EUV mask surface according to an angle adjustment of the plane mirror according to FIG. 5. As illustrated in FIG. 6, the simulation result shows that the angle distribution of the illumination light irradiated to the EUV mask surface through can be freely adjusted through the angle adjustment of the plane mirror 211.

As described above, the present invention can inspect an EUV mask at a high speed by implementing the freeform illumination system through the angle scanning by using the combination of one spherical mirror and the plane mirror and the elliptical mirror of the optical path changing means without using the conventional expensive aspheric lens.

In addition, the present invention can obtain the existing freeform illumination light by using the spherical mirror and the optical path changing means without using the conventional expensive aspherical lens, thereby reducing optical system costs and simplifying the structure.

Furthermore, the present invention can obtain uniformity of illumination only by using the spherical mirror and the plane mirror, thereby more precisely measuring the EUV mask.

Although the present invention has been described in connection with the preferred embodiment for illustrating the principle of the present invention, the present invention is not limited to the aforementioned specific embodiment. It will be appreciated to those skilled in the art that the present invention can be changed and modified in various manners without departing from the spirit and scope of the present invention. Accordingly, all proper changes, modifications, and equivalents should be construed as belonging to the scope of the present invention.

What is claimed is:

1. A high performance EUV microscope device with a freeform illumination system having an elliptical mirror comprising:
 an EUV source for outputting EUV light;
 a spherical mirror having a two-axis driving unit which receives and reflects the EUV light output from the EUV light source and controls a reflection direction of the incident light through two-axis angle scanning;
 an optical path changing means for receiving the reflected light reflected from the spherical mirror and providing illumination light to a target object to be measured, wherein the optical path changing means comprises:
  one plane mirror receiving the reflected light reflected from the spherical mirror to determine an angle of the illumination light provided to the target object to be measured; and
  an elliptical mirror forming freeform illumination light through the plane mirror to be incident to the target object,
 a zone plate lens for focusing the light reflected after entering the target object; and
 a photodetector for receiving the light focused by the zone plate lens,
 wherein the spherical mirror is rotated by the driving unit to control the reflection direction of the reflected light, and the illumination light irradiated to the target object is controlled by the optical path changing means receiving the reflected light,
 wherein the optical path changing means selectively controls a reflection angle of the spherical mirror and a reflection angle of the plane mirror to determine a reflection angle,
 wherein in order to have a uniform intensity distribution of the illumination light irradiated to the target object to be measured, the plane mirror controls the angle of the spherical mirror in a fixed state so as to control the intensity distribution of the illumination light, and wherein in order to determine an incident angle distribution of the illumination light irradiated to the target object, the spherical mirror controls the angle of the plane mirror in a fixed state so as to control the incident angle of the illumination light,
 wherein the elliptical mirror is designed such that the illumination light having a plurality of optical axes incident through the plane mirror has reflection characteristics to enter the same position of the target object, so that the illumination light enters the same position of the target object even in a case of entering with multiple optical axes, and wherein the incident angle of light entering the target object is determined according to the position that the illumination light reflected from the plane mirror enters the elliptical mirror.

2. The high performance EUV microscope device according to claim 1, wherein the angle of the spherical mirror is adjusted to adjust a position of light entering the plane mirror, and
 wherein the angle of the plane mirror is adjusted to adjust an incident angle of the illumination light irradiated to the target object.

3. The high performance EUV microscope device according to claim 2, wherein the plane mirror of the optical path changing means includes a two-axis driving unit, and controls a driving unit for controlling the angle of the spherical mirror and a driving unit for controlling the angle of the plane mirror so as to selectively control the position and angle of the illumination light.

4. The high performance EUV microscope device according to claim 1, wherein the EUV light source is a high-order harmonic generation (HHG) type EUV source or a coherent EUV source.

5. The high performance EUV microscope device according to claim 1, wherein the plane mirror is driven at two-dimensional angle to scan illumination light according to a position of the target object.

6. The high performance EUV microscope device according to claim 1, wherein in order to have the uniform intensity distribution of the illumination light irradiated to the target object to be measured, the plane mirror controls the angle of the spherical mirror in the fixed state so as to control the total cumulative irradiation amount at a position where illumination light is irradiated to the target object to have the same value, and after completion of the scanning measurement of a predetermined region of the target object, the target object is moved through a stage determining X-axis and Y-axis direction driving of the target object, and then, the angle of the spherical mirror is controlled with respect to the predetermined region so as to perform scanning measurement with respect to the predetermined region so that the total cumulative irradiation amount with respect to the corresponding region has the same value.

7. The high performance EUV microscope device according to claim 1, wherein since the elliptical mirror is designed such that the illumination light having the plurality of optical axes incident through the plane mirror has reflection characteristics to enter the same position of the target object, the elliptical mirror allows the incident light having the multiple optical axes to enter the same position of the target object through the plane mirror in a fixed state without any driving unit.

8. The high performance EUV microscope device according to claim 7, wherein the incident light incident to the target object enters the same position at different angles, and assuming that the total cumulative irradiation amount is I1 and the total cumulative irradiation amount of light entering another position near the same position is I2, I1 and I2 are controlled to have the same value.

* * * * *